United States Patent
Midorikawa

(10) Patent No.: US 8,649,231 B2
(45) Date of Patent: Feb. 11, 2014

(54) SEMICONDUCTOR MEMORY DEVICE WITH DELAY CIRCUIT AND SENSE AMPLIFIER CIRCUIT

(75) Inventor: Tsuyoshi Midorikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 247 days.

(21) Appl. No.: 13/206,679

(22) Filed: Aug. 10, 2011

(65) Prior Publication Data

US 2012/0147683 A1   Jun. 14, 2012

(30) Foreign Application Priority Data

Dec. 9, 2010   (JP) ................................ 2010-274940

(51) Int. Cl.
*G11C 7/00*   (2006.01)

(52) U.S. Cl.
USPC ......... 365/194; 365/191; 365/207; 365/210.1

(58) Field of Classification Search
USPC ....... 365/191 X, 194 O, 207 X, 208, 210.1 X, 365/191, 194, 207, 210.1
See application file for complete search history.

(56) References Cited

U.S. PATENT DOCUMENTS

| | | | | |
|---|---|---|---|---|
| 4,333,168 A | * | 6/1982 | Mashiko et al. | ......... 365/210.13 |
| 6,717,877 B2 | * | 4/2004 | Suzuki et al. | ............ 365/210.12 |
| 7,477,561 B2 | * | 1/2009 | Hirabayashi | ................ 365/210.1 |
| 7,593,276 B2 | * | 9/2009 | Hirabayashi | ................ 365/210.1 |
| 7,613,055 B2 | * | 11/2009 | Chang | ........................... 365/194 |
| 7,916,563 B2 | * | 3/2011 | Chang | ........................... 365/194 |
| 8,279,693 B2 | * | 10/2012 | Wang | ............................ 365/205 |

FOREIGN PATENT DOCUMENTS

JP   2006-073161   3/2006

* cited by examiner

*Primary Examiner* — Vanthu Nguyen

(74) *Attorney, Agent, or Firm* — White & Case LLP

(57) ABSTRACT

A memory cell is provided at an intersection of a word line and a bit line, and a dummy cell is provided at an intersection of a dummy word line and a dummy bit line. A delay circuit delays a signal read into the dummy bit line to generate a sense amplifier activating signal. A sense amplifier circuit starts an operation based on a change in the sense amplifier activating signal, and detects/amplifies a signal read out from the memory cell into the bit line. The delay circuit is configured having a first logical gate circuit and a second logical gate circuit alternately cascade-connected. A second delay time is longer than a first delay time, the second delay time being a time required for an output signal of the second logical gate circuit to switch from a first logical state to a second logical state, and a first delay time being a time required for an output signal of the first logical gate circuit to switch from a first logical state to a second logical state.

11 Claims, 3 Drawing Sheets

SEMICONDUCTOR MEMORY DEVICE WITH DELAY CIRCUIT AND SENSE AMPLIFIER CIRCUIT

CROSS REFERENCE TO RELATED APPLICATIONS

This application is based on and claims the benefit of priority from prior Japanese Patent Application No. 2010-274940, filed on Dec. 9, 2010, the entire contents of which are incorporated herein by reference.

FIELD

Embodiments described herein relate to a semiconductor memory device.

BACKGROUND

In a general semiconductor memory device, data read is performed by detecting/amplifying a signal that appears in a bit line depending on data stored in a memory cell. This detecting/amplifying of the signal appearing in the bit line is performed with a certain timing by means of a sense amplifier circuit. Therefore, in order to increase operational speed of the semiconductor memory device, it is desired to reduce time from selection of the memory cell to sense amplifier activation.

However, if activation of the sense amplifier circuit is early, a detection/amplification operation of the sense amplifier circuit starts before a sufficient potential difference appears in a bit line pair, leading to an increased possibility of a mistaken read being performed. Therefore, it is required to set an optimal timing at which a mistaken read does not occur and at the same time operational speed can be increased.

Accordingly, one known example of technology for generating an activating signal of a sense amplifier at an appropriate timing is a semiconductor memory device configured to delay by means of a delay circuit a signal read from a dummy cell, and supply this delayed signal to the sense amplifier as a sense amplifier activating signal. This device includes a dummy cell having an identical or similar structure to a memory cell in a memory cell array and configured to retain data fixedly. Moreover, the device is configured such that a row address signal is inputted to a dummy word line connected to this dummy cell, a signal read out from the dummy cell into a dummy bit line is delayed by means of the delay circuit to generate the sense amplifier activating signal, and this sense amplifier activating signal is inputted to the sense amplifier.

Meanwhile, there is a tendency that, along with advances in miniaturization of a memory cell, power supply voltage of a semiconductor memory device is also lowered. If the power supply voltage is lowered, sensitivity of the sense amplifier is lowered, and at the same time speed of change of voltage in the bit line pair during a read operation is reduced. As a result, when power supply voltage is lowered, it becomes gradually more difficult to judge data retained in a memory cell accurately and at high speed.

DETAILED DESCRIPTION

A semiconductor memory device according to an embodiment of the present invention comprises: a memory cell array configured having memory cells arranged therein, each of the memory cells provided at an intersection of a word line and a bit line; and a dummy cell provided at an intersection of a dummy word line and a dummy bit line and configured to retain certain data fixedly. A delay circuit delays a signal read into the dummy bit line to generate a sense amplifier activating signal. A sense amplifier circuit starts an operation based on a change in the sense amplifier activating signal, and detects/amplifies a signal read out from the memory cell into the bit line. The delay circuit is configured having a first logical gate circuit and a second logical gate circuit cascade-connected. The first logical gate circuit and the second logical gate circuit are configured such that a second delay time is longer than a first delay time, the second delay time being a time required for an output signal of the second logical gate circuit to switch from a first logical state to a second logical state, and the first delay time being a time required for an output signal of the first logical gate circuit to switch from a first logical state to a second logical state.

Next, embodiments of the present invention are described in detail with reference to the drawings. The embodiments below are described taking as an example the case where the present invention is applied to a Static Random Access Memory (SRAM). However, it goes without saying that the present invention is not limited to this example and is applicable also to other semiconductor memory devices capable of utilizing a dummy circuit having an arrangement of dummy cells.

Figure 1:
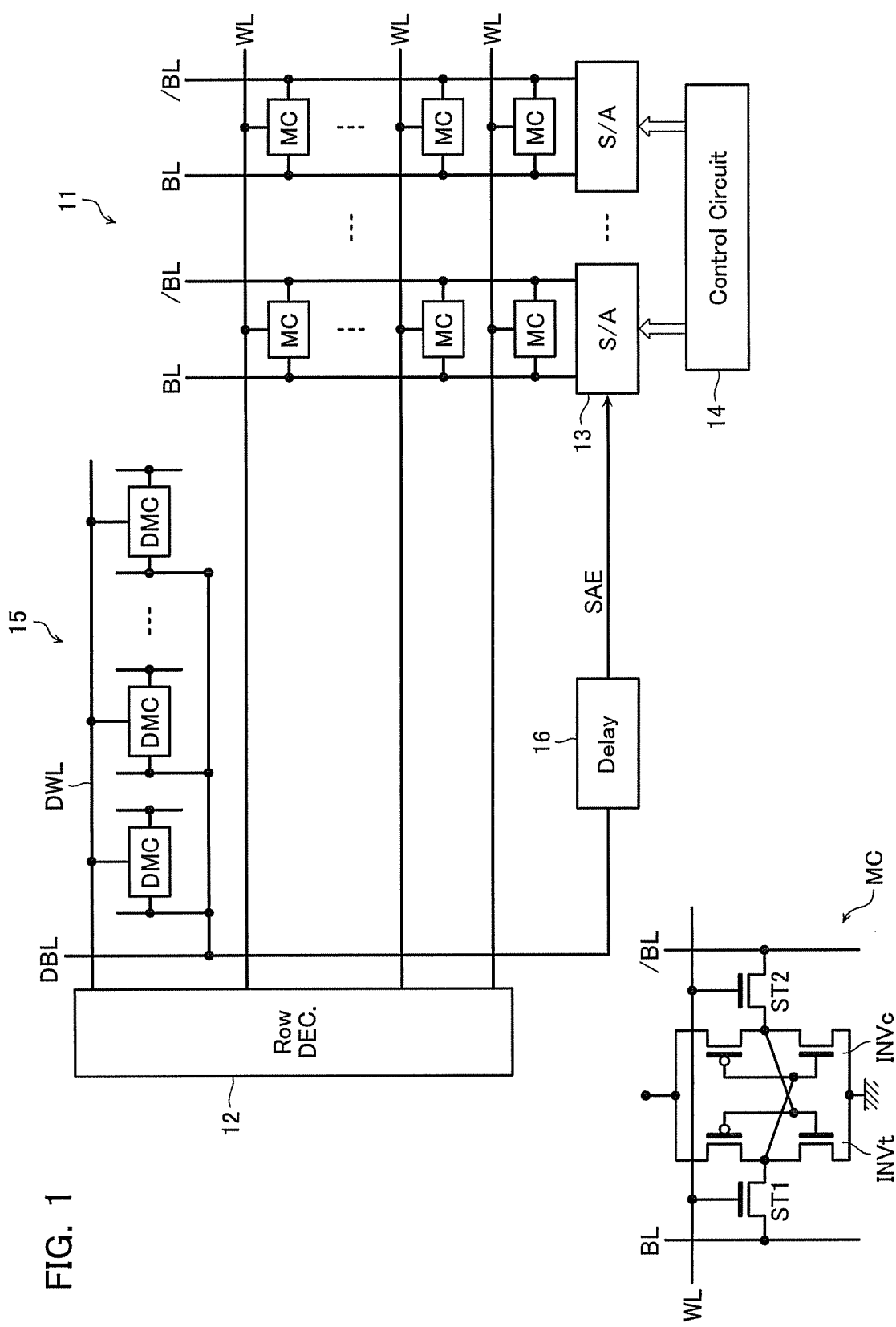
FIG. 1 is a circuit diagram showing an overall configuration of a semiconductor memory device according to a first embodiment of the present invention.

First, an overall configuration of a semiconductor memory device according to an embodiment of the present invention is described with reference to FIG. 1. As shown in FIG. 1, the semiconductor memory device in the present embodiment is broadly configured from a memory cell array 11, a row decoder 12, a sense amplifier circuit 13, a control circuit 14, a dummy cell array 15, and a delay circuit 16.

The memory cell array 11 is configured having a plurality of memory cells MC arranged in a matrix at intersections of bit line pairs BL, /BL and word lines WL. Each memory cell MC may be one which has, for example, a pair of inverters INVt, INVc inverse-parallel connected and comprises select transistors ST1, ST2 between connection nodes of the inverters INVt, INVc and the bit line pair BL, /BL.

In addition, the row decoder 12 is provided as a configuration for selecting a memory cell MC by selectively providing a select signal to any of the plurality of word lines WL. Moreover, the sense amplifier circuit 13 is provided for detecting/amplifying the signal read out from the selected memory cell MC into the bit line pair BL, /BL. The control circuit 14 administers control of the device overall including the sense amplifier circuit 13.

The dummy cell array 15 is configured having a plurality of dummy cells DMC arranged therein at intersections of a dummy bit line DBL and a dummy word line DWL. Each dummy cell DMC retains certain data fixedly, and, moreover, has a structure that is identical to or similar to that of the memory cell MC. When the dummy word line DWL is selected, a signal based on the retained data appears in the dummy bit line DBL. The delay circuit 16 delays this signal in the dummy bit line DBL and outputs a delay signal (sense amplifier activating signal SAE) configured to rise delayed by a certain period after a fall of this signal in the dummy bit line DBL. The sense amplifier circuit 13 is activated to begin an operation based on a change in logic of this sense amplifier activating signal SAE, and detects/amplifies a signal read out from the memory cell MC into the bit line BL.

Figure 2:
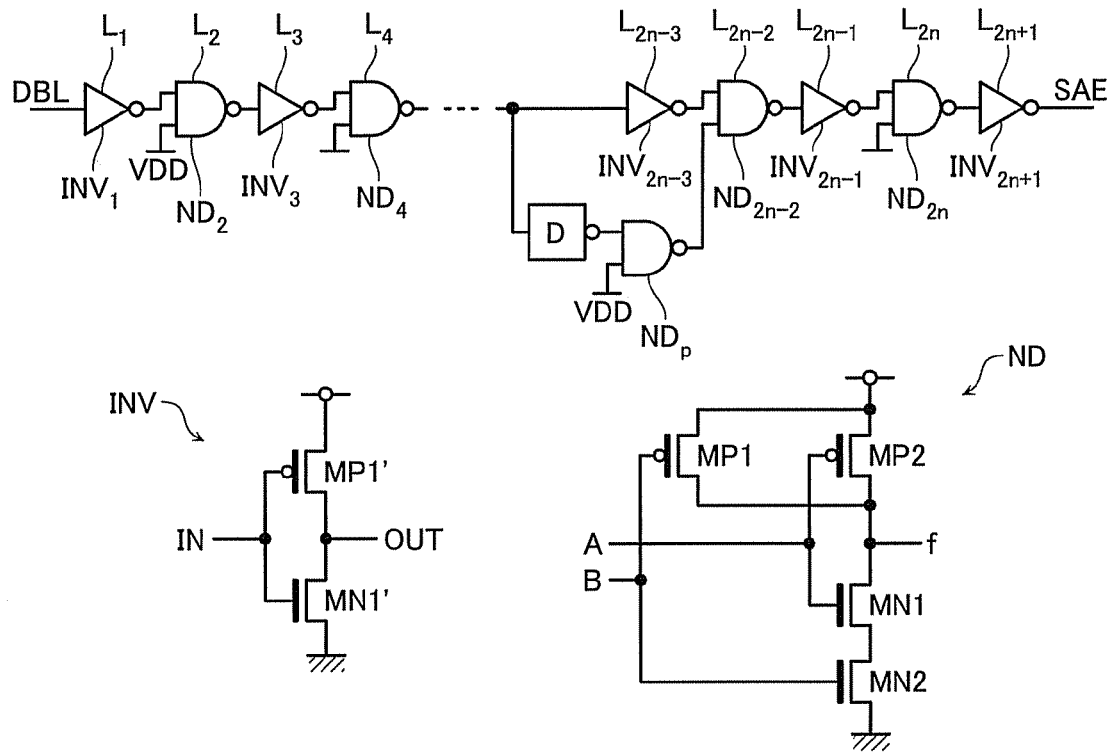
FIG. 2 is a circuit diagram showing a specific example of a configuration of a delay circuit 16 in FIG. 1.

Next, one example of a specific configuration of this delay circuit 16 is described with reference to FIG. 2. As shown in FIG. 2, the delay circuit 16 is configured having a plurality of logical gate circuits $L_1$-$L_{2n+1}$ cascade-connected (n is an integer). Note that a delay circuit D and a NAND gate NDp are also connected in parallel to these logical gate circuits. These delay circuit D and NAND gate NDp are provided to make the sense amplifier activating signal SAE into a pulse waveform that rises only for a certain period.

Odd-numbered logical gate circuits $L_1$, $L_3$, ..., $L_{2n-3}$, $L_{2n-1}$, $L_{2n+1}$ are each an inverter INV ($INV_1$, $INV_3$, ..., $INV_{2n-3}$, $INV_{2n-1}$, $INV_{2n+1}$). In contrast, even-numbered logical gate circuits $L_2$, $L_4$, ..., $L_{2n-2}$, $L_{2n}$ are each a NAND gate ND ($ND_2$, $ND_4$, ..., $ND_{2n-2}$, $ND_{2n}$). During a read operation in this semiconductor memory device of FIG. 1, the signal in the dummy bit line DBL first falls from "H" level to "L" level. At this time, an output signal in odd-numbered stage logical gate circuits in the delay circuit 16 rises conversely from "L" level to "H" level. On the other hand, an output signal in even-numbered stage logical gate circuits in the delay circuit 16 falls from "H" level to "L" level. In the present embodiment, a NAND gate ND forms a logic gate circuit in which an output signal falls from "H" level to "L" level in response to the signal in the dummy bit line DBL, that is, in response to an input signal to the delay circuit 16, falling from "H" level to "L" level (here, even-numbered stage logical gate circuits in the delay circuit 16 are NAND gate ND). The logical gate circuits L are configured such that a time T2 required for the output signal of the even-numbered stage logical gate circuits $L_2$, $L_4$, ..., $L_{2n-2}$, $L_{2n}$ to switch from "H" to "L" is longer than a time T1 required for the output signal of the odd-numbered stage logical gate circuits $L_1$, $L_3$, ..., $L_{2n-3}$, $L_{2n-1}$, $L_{2n+1}$ to switch from "H" to "L". For example, as described above, the odd-numbered stage logical gate circuits $L_1$, $L_3$, ..., $L_{2n-3}$, $L_{2n-1}$, $L_{2n+1}$ are configured as inverters INV, and the even-numbered stage logical gate circuits $L_2$, $L_4$, ..., $L_{2n-2}$, $L_{2n}$ are configured as NAND gates ND.

As shown in FIG. 2, the NAND gate ND comprises PMOS transistors MP1, MP2 connected in parallel between a power supply voltage terminal and an output terminal (f), and NMOS transistors MN1, MN2 connected in series between the output terminal (f) and a ground terminal. An input terminal A is connected to gates of the PMOS transistor MP2 and the NMOS transistor MN1, and an input terminal B is connected to gates of the PMOS transistor MP1 and the NMOS transistor MN2 On the other hand, the inverter INV is configured having one PMOS transistor MP1' and one NMOS transistor MN1' connected in series (the NMOS transistor MN1' is connected between an output terminal and a ground terminal). That is, the number of NMOS transistors in the inverter INV that are in a conductive state when the output signal of the inverter INV is "L" is one, while the number of NMOS transistors in the NAND gate ND that are in a conductive state when the output signal of the NAND gate ND is "L" is two (second number), which is greater than the number of NMOS transistors (one: first number) in the inverter INV. As a result, the time T2 required for the output signal of the NAND gate ND to switch from "H" to "L" is longer than the time T1 required in the case of the inverter INV.

The NAND gate ND has one input terminal connected to an output terminal of a previous stage inverter INV, and another input terminal fixedly applied with a power supply voltage Vdd, for example. As a result, the NAND gate ND functions as an inverter.

As described above, in the first embodiment, the inverter INV and the NAND gate ND are alternately cascade-connected to configure the delay circuit 16. The reason why the former is in an odd-numbered stage and the latter is configured as an even-numbered stage is because the signal in the dummy bit line DBL inputted to the delay circuit 16 of FIG. 1 is a signal which falls from "H" to "L" subsequent to start of a read operation of the dummy cell DMC (this is described in detail later). Conversely, if the signal inputted to the delay circuit 16 is a signal switching from "L" to "H", all that is required is to configure the latter as an odd-numbered stage and the former as an even-numbered stage.

Next, a specific configuration of a delay circuit 16 in a comparative example of the embodiment is described with reference to FIG. 3. In this comparative example, a plurality of logical gate circuits $L'_1$-$L'_{2n+1}$ are cascade-connected, similarly to in FIG. 2. However, all except one of those plurality of logical gate circuits L' are configured by an inverter INV.

Figure 3:
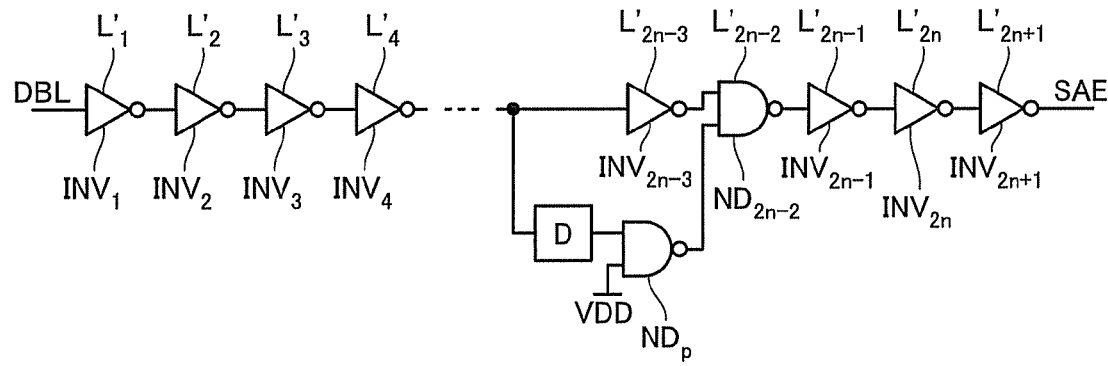
FIG. 3 is a circuit diagram of a delay circuit according to a comparative example.

Compared to the delay circuit 16 in the comparative example of FIG. 3, the delay circuit 16 of FIG. 2 can raise the sense amplifier activating signal SAE with an appropriate timing and activate the sense amplifier circuit 13 with an appropriate timing, even when the power supply voltage is lowered.

Figure 4:
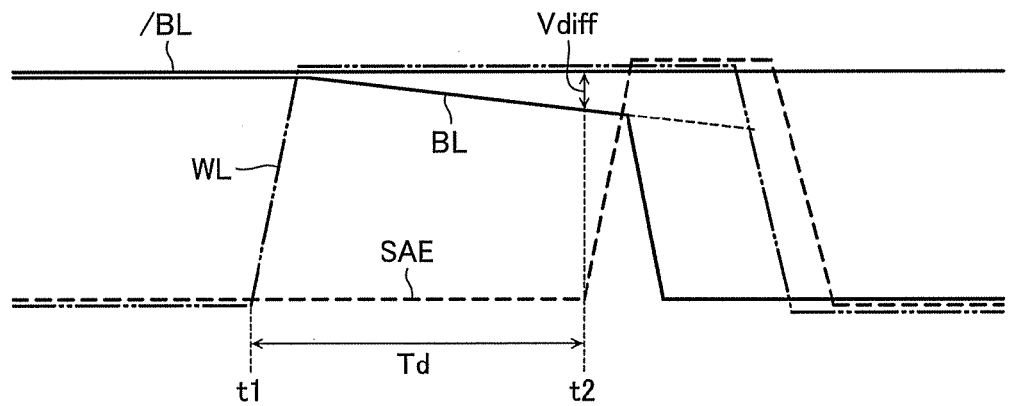
FIG. 4 is a graph showing operation of a semiconductor memory device according to the first embodiment.

Operation of the semiconductor memory device in the present embodiment is described with reference to FIG. 4. In the case of reading data from the memory cell MC, the bit line pair BL, /BL are charged to, for example, the power supply voltage Vdd, and then, at time t1, a potential of the word line WL connected to the selected memory cell MC is raised from "L" to "H". Then, retained data of the selected memory cell MC is read into the bit line BL(, /BL), whereby the potential difference between the bit line pair BL, /BL gradually increases.

Meanwhile, although not shown in the drawings, a potential of the dummy word line DWL also switches from "L" to "H" with an almost identical timing to that at which the potential of the word line WL rises from "L" to "H". As a result, the signal in the dummy bit line DBL switches from "H" to "L", and this signal is supplied to the delay circuit 16. The delay circuit 16 delays this signal. For example, at time t2, it raises the sense amplifier activating signal from "L" to "H", and starts operation of the sense amplifier circuit 13. A delay amount Td (t2-t1) in the delay circuit 16 is set in consideration of a potential difference Vdiff between the bit line pair BL, /BL anticipated when a certain power supply voltage is applied.

At time t2 when the potential difference between the bit line pair BL, /BL has increased to a magnitude amplifiable by the sense amplifier 13, the sense amplifier activating signal SAE is raised from "L" to "H". As a result, the retained data of the selected memory cell MC is read.

Figure 5:
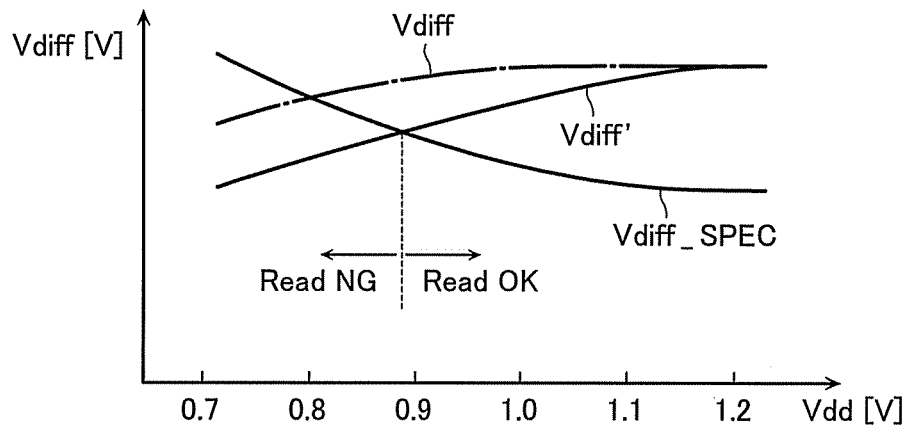
FIG. 5 is a graph explaining advantages of the semiconductor memory device according to the first embodiment.

By the way, a speed of change (inclination) in the potential of the bit line pair BL, /BL decreases as the power supply voltage Vdd decreases. At the same time, the time t2 of rise of the sense amplifier activating signal SAE outputted by the delay circuit 16 is also increasingly delayed as the power supply voltage Vdd lowers. However, as a whole, the potential difference Vdiff between the bit line pair BL, /BL at time t2 when the sense amplifier activating signal SAE rises from "L" to "H" lowers as the power supply voltage Vdd lowers (refer to FIG. 5). As this potential difference Vdiff approaches a voltage Vdiff_SPEC which is a minimum voltage required for a detection/amplification operation to be performed by the sense amplifier circuit 13, a read margin is reduced. When the potential difference Vdiff falls below the voltage Vdiff_SPEC, the data read operation becomes impossible.

In the delay circuit of the comparative example (FIG. 3), as the power supply voltage Vdd becomes smaller, a potential difference Vdiff' between the bit line pair BL, /BL at time t2 when the sense amplifier activating signal SAE rises from "L" to "H" becomes lower. The degree of lowering of the potential difference Vdiff' becomes more significant as the power supply voltage Vdd becomes smaller.

In contrast, in the delay circuit 16 of the present embodiment (FIG. 2), as the power supply voltage Vdd becomes smaller, a potential difference Vdiff between the bit line pair BL, /BL at time t2 when the sense amplifier activating signal SAE rises from "L" to "H" becomes lower. However, the degree of lowering is substantially suppressed compared to the case of potential difference Vdiff' in FIG. 3. As a result, the delay circuit 16 of FIG. 2 allows an accurate and high speed detection operation to be achieved under a relatively-low power supply voltage Vdd.

Described now is the reason why, in the first embodiment using the delay circuit 16 of FIG. 2, dependency of the potential difference Vdiff on the power supply voltage Vdd is small, and in the comparative example using the delay circuit 16 of FIG. 3, dependency of the potential difference Vdiff' on the power supply voltage Vdd is large.

When the dummy bit line DBL switches from "H" to "L", the delay circuit of FIG. 2 operates as follows. That is, a PMOS transistor in each of the odd-numbered stage inverters INV (INV$_1$, INV$_3$, . . . , INV$_{2n-3}$, INV$_{2n-1}$, INV$_{2n+1}$) is switched to a conductive state, while an NMOS transistor in each of the odd-numbered stage inverters INV is switched to a non-conductive state. On the other hand, two NMOS transistors MN1 and MN2 (FIG. 2) series-connected in the even-numbered stage NAND gates ND (ND$_2$, ND$_4$, . . . , ND$_{2n-2}$, ND$_{2n}$) are switched to a conductive state, thereby switching a voltage of the output terminal (f) from "H" (Vdd) to "L" (ground voltage Vss), while at the same time two internal PMOS transistors MP1 and MP2 in the NAND gates ND are switched to a non-conductive state. This operation is similar to a discharge operation in a memory cell MC in the sense that an output node is discharged by two series-connected NMOS transistors (in the memory cell MC, the bit lines BL or /BL are discharged by two transistors, namely one NMOS transistor in the inverter INVp or INVc and the select transistor ST). In the even-numbered NAND gates ND in the delay circuit 16 of FIG. 2, the discharge operation of the output terminal (f) is executed in this way by the two series-connected NMOS transistors MN1, MN2, similarly to the discharge operation of the bit line BL in the memory cell MC.

In contrast, in the discharge operation in the even-numbered stage inverters INV$_2$, INV$_4$, . . . in the delay circuit of FIG. 3, only one NMOS transistor in the inverters INV$_{2, 4}$ . . . is involved in the discharge operation of the output terminal of those inverters. This differs from the discharge operation being performed from two series-connected NMOS transistors in the memory cell MC. Such a difference leads to the extent of the effect of lowering of the power supply voltage Vdd also differing between the memory cell MC and the delay circuit 16.

By matching the number of NMOS transistors involved in the discharge operation in the memory cell MC and the number of NMOS transistors involved in the discharge operation in the delay circuit 16 (both two in the first embodiment), the difference in degree of effect regarding lowering of the power supply voltage Vdd can be reduced between the memory cell MC and the delay circuit 16. In the delay circuit 16 of FIG. 3, the numbers of these two are not matched, hence lowering of the power supply voltage Vdd causes the potential difference Vdiff to lower greatly, thereby making it difficult to perform a high speed and accurate read operation at a low power supply voltage.

Note that it is preferable for channel implantation to the NMOS transistors in the delay circuit 16, particularly to the NMOS transistors MN1, MN2 in the NAND gate ND to be performed in a batch together with channel implantation to the NMOS transistors in the memory cell MC. This is because execution of batch channel implantation enables characteristics of both delay circuit and memory cell NMOS transistors to be coordinated.

[Second Embodiment]

Figure 6:
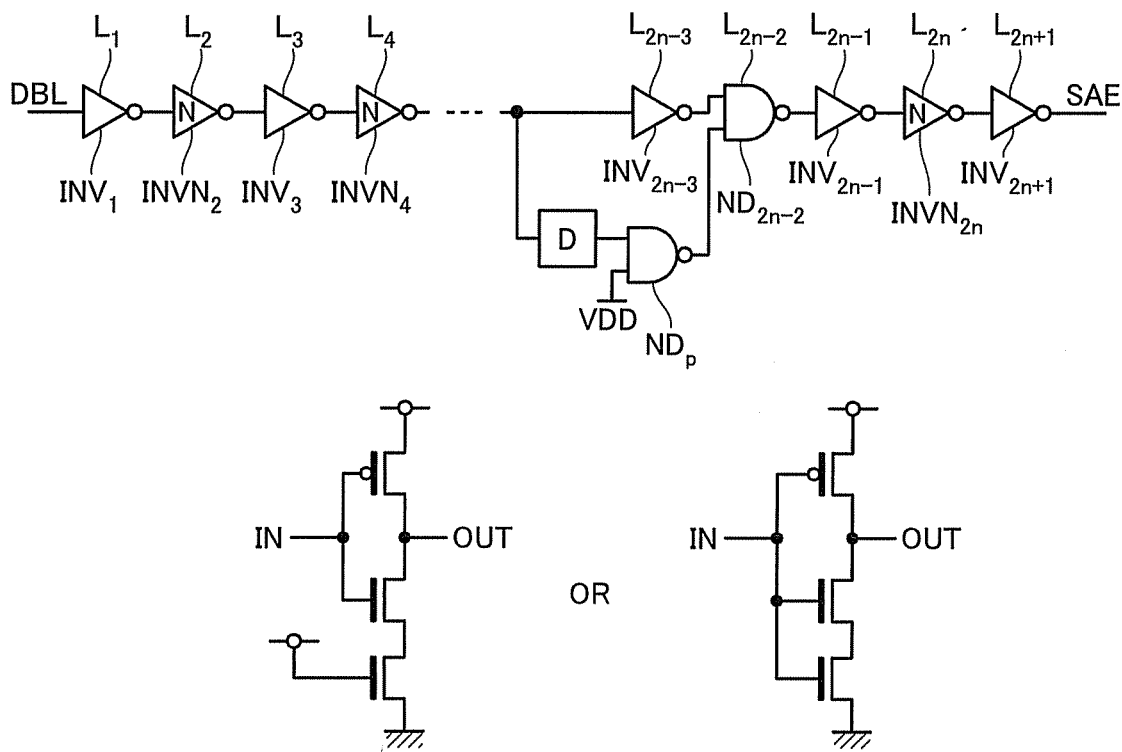
FIG. 6 is a circuit diagram showing a specific example of a configuration of a delay circuit 16 in a semiconductor memory device according to a second embodiment.

Next, a second embodiment of the present invention is described with reference to FIG. 6. Overall configuration of the device is similar to that of the first embodiment, and only configuration of the delay circuit 16 differs from that of the first embodiment. In this embodiment, the delay circuit 16 has a structure as shown in FIG. 6.

The difference from the first embodiment (FIG. 2) is that the even-numbered stage logical gate circuits L$_2$, L$_4$, . . . , L$_{2n-2}$, L$_{2n}$ are also inverters. However, those inverters are NMOS multi-stage inverters INVN$_2$, INVN$_4$, . . . in which the number of NMOS transistors included therein is larger than that of PMOS transistors. As a result, similar advantages to those of the first embodiment can be displayed.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, in the above-described embodiments, delay time with which the output signal of each of the logical gate circuits switches from "H" to "L" is adjusted by making the number of NMOS transistors connected between the output terminal in the logical gate circuit L and the ground terminal differ between an even-numbered stage and an odd-numbered stage. However, the present invention is not limited to this, and similar advantages may also be displayed by, for example, setting the number of NMOS transistors to be the same, while changing gate length or gate width of the NMOS transistors.

What is claimed is:
1. A semiconductor memory device, comprising:
  a memory cell array configured having memory cells arranged therein, each of the memory cells provided at an intersection of a word line and a bit line;
  a dummy cell provided at an intersection of a dummy word line and a dummy bit line and configured to retain certain data fixedly;

a delay circuit configured to delay a signal read into the dummy bit line to generate a sense amplifier activating signal; and a sense amplifier circuit configured to start an operation based on a change in the sense amplifier activating signal, and detect/amplify a signal read out from the memory cell into the bit line, the delay circuit being configured having a first logical gate circuit and a second logical gate circuit cascade-connected, and the first logical gate circuit and the second logical gate circuit being configured such that a second delay time is longer than a first delay time, the second delay time being a time required for an output signal of the second logical gate circuit to switch from a first logical state to a second logical state, and the first delay time being a time required for an output signal of the first logical gate circuit to switch from a first logical state to a second logical state, wherein the delay circuit is configured having the first logical gate circuit and the second logical gate circuit alternately cascade-connected between an input terminal and an output terminal of the delay circuit.

2. The semiconductor memory device of claim 1, wherein the first logical gate circuit has NMOS transistors, the number of NMOS transistors that is in a conductive state when an output signal of the first logical gate circuit is in the second logical state being a first number, the second logical gate circuit has NMOS transistors, the number of NMOS transistors that is in a conductive state when an output signal of the second logical gate circuit is in the second logical state being a second number larger than the first number.

3. The semiconductor memory device of claim 2, wherein the first logical gate circuit is an inverter comprising the first number of NMOS transistors connected between an output terminal of the first logical gate circuit and a ground terminal, and the second logical gate circuit is a logical gate circuit including the second number of NMOS transistors connected between an output terminal of the second logical gate circuit and a ground terminal.

4. The semiconductor memory device of claim 2, wherein the first logical gate circuit is a first inverter comprising the first number of NMOS transistors connected between an output terminal of the first logical gate circuit and a ground terminal, and the second logical gate circuit is a second inverter including the second number of NMOS transistors connected in series between an output terminal of the second logical gate circuit and a ground terminal.

5. A semiconductor memory device, comprising:

a memory cell array configured having memory cells arranged therein, each of the memory cells provided at an intersection of a word line and a bit line;

a dummy cell provided at an intersection of a dummy word line and a dummy bit line and configured to retain certain data fixedly;

a delay circuit configured to delay a signal read into the dummy bit line to generate a sense amplifier activating signal; and a sense amplifier circuit configured to start an operation based on a change in the sense amplifier activating signal, and detect/amplify a signal read out from the memory cell into the bit line, the delay circuit being configured having a first logical gate circuit and a second logical gate circuit cascade-connected, and the first logical gate circuit and the second logical gate circuit being configured such that a second delay time is longer than a first delay time, the second delay time being a time required for an output signal of the second logical gate circuit to switch from a first logical state to a second logical state, and the first delay time being a time required for an output signal of the first logical gate circuit to switch from a first logical state to a second logical state, wherein the first logical gate circuit has NMOS transistors, the number of NMOS transistors that is in a conductive state when an output signal of the first logical gate circuit is in the second logical state being a first number, the second logical gate circuit has NMOS transistors, the number of NMOS transistors that is in a conductive state when an output signal of the second logical gate circuit is in the second logical state being a second number larger than the first number.

6. The semiconductor memory device of claim 5, wherein the first logical gate circuit is an inverter comprising the first number of NMOS transistors connected between an output terminal of the first logical gate circuit and a ground terminal, and the second logical gate circuit is a logical gate circuit including the second number of NMOS transistors connected between an output terminal of the second logical gate circuit and a ground terminal.

7. The semiconductor memory device of claim 5, wherein the first logical gate circuit is a first inverter comprising the first number of NMOS transistors connected between an output terminal of the first logical gate circuit and a ground terminal, and the second logical gate circuit is a second inverter including the second number of NMOS transistors connected in series between an output terminal of the second logical gate circuit and a ground terminal.

8. A semiconductor memory device, comprising:

a memory cell array configured having memory cells arranged therein, each of the memory cells provided at an intersection of a word line and a bit line:, a dummy cell provided at an intersection of a dummy word line and a dummy bit line and configured to retain certain data fixedly;

a delay circuit configured to delay a signal read into the dummy bit line to generate a sense amplifier activating signal; and a sense amplifier circuit configured to start an operation based on a change in the sense amplifier activating signal, and detect/amplify a signal read out from the memory cell into the bit line, the delay circuit being configured having a first logical gate circuit and a second logical gate circuit cascade-connected, the first logical gate circuit and the second logical gate circuit being configured such that a second delay time is longer than a first delay time, the second delay time being a time required for an output signal of the second logical gate circuit to switch from a first logical state to a second logical state, and the first delay time being a time required for an output signal of the first logical gate circuit to switch from a first logical state to a second logical state, and a transistor configuring the memory cell and a transistor configuring the delay circuit each having a channel portion subjected to an identical ion implantation, wherein the delay circuit is configured having the first logical gate circuit and the second logical gate circuit alternately cascade-connected between an input terminal and an output terminal of the delay circuit.

9. The semiconductor memory device of claim 8, wherein the first logical gate circuit has NMOS transistors, the number of NMOS transistors that is in a conductive state when an output signal of the first logical gate circuit is in the second logical state being a first number, the second logical gate circuit has NMOS transistors, the number of NMOS transistors that is in a conductive state when an output signal of the second logical gate circuit is in the second logical state being a second number larger than the first number.

10. The semiconductor memory device of claim 9, wherein the first logical gate circuit is an inverter comprising the first number of NMOS transistors connected between an output terminal of the first logical gate circuit and a ground terminal, and the second logical gate circuit is a logical gate circuit including the second number of NMOS transistors connected between an output terminal of the second logical gate circuit and a ground terminal.

11. The semiconductor memory device of claim 9, wherein the first logical gate circuit is a first inverter comprising the first number of NMOS transistors connected between an output terminal of the first logical gate circuit and a ground terminal, and the second logical gate circuit is a second inverter including the second number of NMOS transistors connected in series between an output terminal of the second logical gate circuit and a ground terminal.

* * * * *